United States Patent
Sinha

(10) Patent No.: US 7,535,714 B1
(45) Date of Patent: May 19, 2009

(54) APPARATUS AND METHOD PROVIDING METALLIC THERMAL INTERFACE BETWEEN METAL CAPPED MODULE AND HEAT SINK

(75) Inventor: Arvind Kumar Sinha, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/931,003

(22) Filed: Oct. 31, 2007

(51) Int. Cl.
*H05K 7/20* (2006.01)
*F28F 7/00* (2006.01)
*H01L 23/34* (2006.01)

(52) U.S. Cl. .............. 361/704; 165/80.2; 165/80.3; 165/185; 257/705; 257/712; 257/713

(58) Field of Classification Search .......... 361/705, 361/708
See application file for complete search history.

(56) References Cited

U.S. PATENT DOCUMENTS

| | | | | |
|---|---|---|---|---|
| 4,612,601 A * | 9/1986 | Watari | .......... | 361/705 |
| 5,285,108 A * | 2/1994 | Hastings et al. | .......... | 257/712 |
| 5,325,265 A * | 6/1994 | Turlik et al. | .......... | 361/702 |
| 5,623,394 A * | 4/1997 | Sherif et al. | .......... | 361/705 |
| 5,724,729 A * | 3/1998 | Sherif et al. | .......... | 29/840 |
| 5,757,620 A * | 5/1998 | Edwards et al. | .......... | 361/705 |
| 5,985,697 A * | 11/1999 | Chaney et al. | .......... | 438/122 |
| 6,016,006 A * | 1/2000 | Kolman et al. | .......... | 257/712 |
| 6,281,575 B1 * | 8/2001 | Nishikawa et al. | .......... | 257/707 |
| 6,752,204 B2 * | 6/2004 | Dishongh et al. | .......... | 165/185 |
| 6,867,977 B2 * | 3/2005 | DiStefano et al. | .......... | 361/705 |
| 7,362,580 B2 * | 4/2008 | Hua et al. | .......... | 361/709 |
| 2004/0174682 A1 * | 9/2004 | Lin et al. | .......... | 361/705 |
| 2005/0168947 A1 * | 8/2005 | Mok et al. | .......... | 361/698 |
| 2006/0244148 A1 * | 11/2006 | Lu | .......... | 257/772 |
| 2007/0290338 A1 * | 12/2007 | Kuczynski | .......... | 257/737 |
| 2008/0153210 A1 * | 6/2008 | Hua et al. | .......... | 438/122 |

* cited by examiner

*Primary Examiner*—Gregory D Thompson
(74) *Attorney, Agent, or Firm*—Robert W. Lahtinen

(57) ABSTRACT

An apparatus and method for creating a metallic thermal interface is shown for connecting an electronic module to a heat sink. Using an interface metal such as indium or malleable indium alloys, which have superior heat transfer capability, but are subject to oxidization and degraded thermal transfer capability; a layer of interface material is confined in a recess in the heat sink base into which the module cap is received. The thermal interface region is then evacuated to bring the module top surface and recess major surface into intimate contact and sealed along the interface of the module and recess side walls to exclude air from the metallic interface region.

13 Claims, 2 Drawing Sheets

APPARATUS AND METHOD PROVIDING METALLIC THERMAL INTERFACE BETWEEN METAL CAPPED MODULE AND HEAT SINK

FIELD OF THE INVENTION

The invention pertains to thermal interfaces and more particularly to a metallic interface that is isolated to preclude compromising thermal conductivity by oxidization.

BACKGROUND AND SUMMARY

As the performance of an electronic device is enhanced there is also an increased requirement for heat dissipation as greater power is utilized. Typical of such an environment is high performance computers where capability is commonly measured in floating point operations per second (flops). Faster microprocessors usually require the use of larger amounts of power. Since it is desirable for performance and reliability to maintain the microprocessor's active metallurgy at a specified temperature, and since the power consumed by the microprocessor is dissipated as heat, advanced heat transfer structures and methods are needed. With the combined challenge of more numerous and powerful microprocessors in a given package, the limits of air cooling are easily exceeded. Traditional thermal interface materials are unable to provide necessary heat transfer required for effectively cooling the multi core modulus.

The structure and method of the present invention utilizes indium as a metallic thermal interface for enhanced heat transfer between a multi chip module, containing a plurality of high performance processor chips and a heat sink. Although indium is an effective thermal transfer material, it is susceptible to corrosion when it is in contact with silicon at 85 degrees C. and 85% relative humidity and also reacts with air to form an oxide with poor thermal conduction properties. Accordingly, to use indium as a thermal interface it is necessary to create a corrosion free environment. The present invention is directed to a cooling mechanism including an indium thermal interface material which is contained within a module-heat sink interface which is evacuated and sealed using a modified threaded heat sink. The interface with metallic indium forms a covalent bond with the heat sink surface.

DETAILED DESCRIPTION

Figure 1:
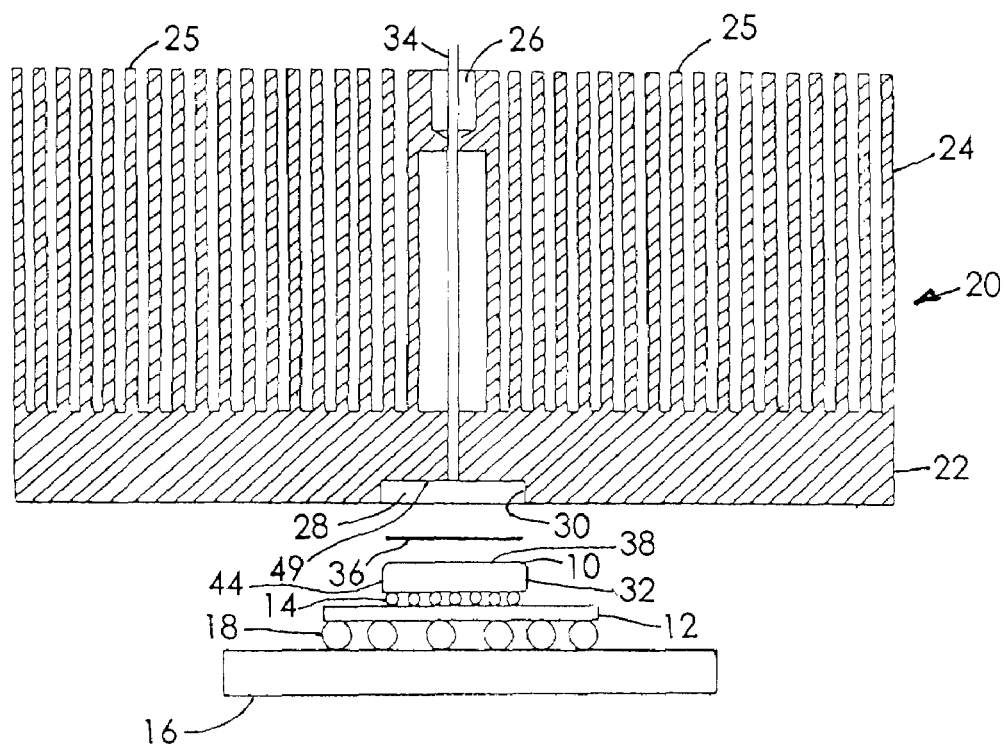
FIG. 1 is an exploded elevation view of a heat sink/multi chip module assembly with the heat sink in section an including modifications for practicing the present invention.

Referring to the drawings, FIG. 1 shows an exploded view, partially in section, of the module/heat sink assembly incorporating the metallic thermal interface of the present invention. A multi chip module 10, illustrated as a microprocessor module, is attached to a substrate 12 by solder balls 14. The substrate 12 is similarly attached to the circuit board 16 by solder balls 18. The heat sink 20 (shown in section) is a modified recessed, threaded design which includes a base portion 22 and an extended surface portion 24 in the form of a series of parallel fins 25. The heat sink includes a recess 26 that includes slotted threads to enable a cooperating threaded tool to remove the heat sink from the module for rework if such is required. A recess 28 is formed in the heat sink base portion 22 with the wall portions 30 defining a recess cross sectional configuration that will closely receive multi chip module metal cap wall surfaces 32. Also carried by heat sink 20 is a flexible tube 34 that extends from and communicates with the recess 28. The layer of indium metal 36 is typically a three or four mil thickness film which is secured to the top surface 38 of the multi chip module by a film of soft silicone gel thermal filler.

Reference is made to indium in this description of the invention; however, it is to be understood that the metallic thermal interface material may include not only indium metal, but also malleable alloys of indium including other metals such as aluminum and/or copper.

Figure 3:
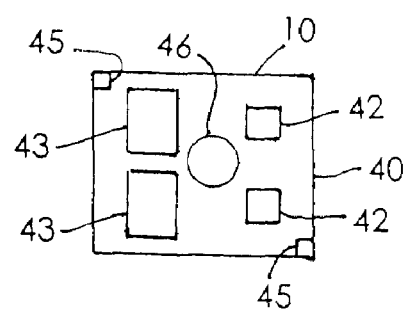
FIG. 3 is a plan view of a microprocessor multi chip module with the cap removed.

FIG. 3 provides a plan view of the multi chip module 10 with the cap removed. A multi layer organic substrate 40 supports and interconnects the processor chips 42 and the memory chips 43. Chips 42 and 43 are enclosed by the multilayer substrate 40 and the metal cap or cover 44 that cooperates therewith. A quantity of gap filler 46 is applied to the substrate 40 to enhance thermal transfer from the substrate 40 to the metal cap 44 (FIG. 1). The thermal gap filler 46 may be in the form of conventional grease enhanced with silicon carbide particles to provide improved thermal transmission or a soft silicon gel thermal gap filler formulated to provide superior thermal performance. A pair of alignment features 45, in the form of upwardly extending projections, are disposed at opposite corners of substrate 40 to align and retain the module cap 44.

Figure 2:
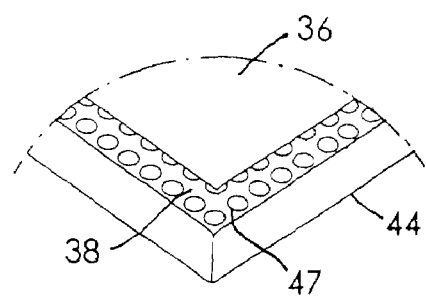
FIG. 2 is a fragmentary view of a corner portion of the module cap and metal interface layer showing an alternate embodiment of the invention.

The top surface 38 of module cap 44 is normally a planar surface. FIG. 2 shows a corner portion of module metal cap 44 and indium layer 36 which illustrates a second embodiment of the thermal interface structure. The top surface 38 includes a matrix of circular bumps or projections 47 to provide projections that facilitate the vacuum evacuation of the interface. Other variations include surface irregularities on the surface 49 of the heat sink base (FIG. 1) or on both module cover and heat sink recess surface and may also include perforations in the indium thermal layer. To assure a continuous contact between the indium metallic thermal interface material 36 and both the module cap surface 38 and the heat sink recess surface 49, the bumps or projections 47 should have a height not exceeding one half the thickness of the layer of metallic interface material 36.

Figure 5:
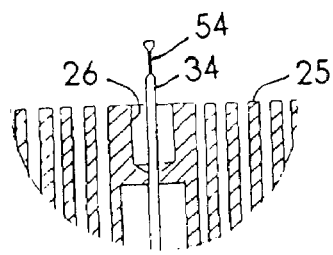
FIG. 5 is a fragmentary view showing a portion of the fin portion of the heat sink illustrating crimped, sealed and terminated vacuum tube.
Figure 4:
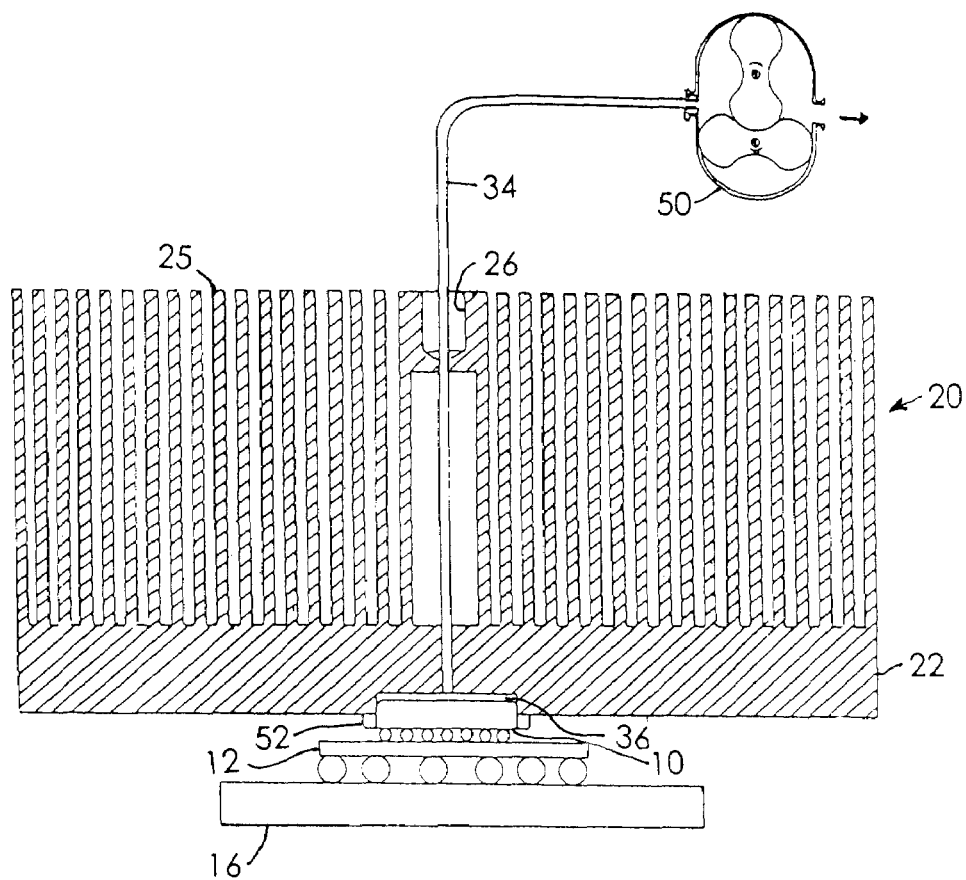
FIG. 4 is similar to FIG. 1 showing the elements in assembled form and including a vacuum pump used to evacuate and seal the interface.

FIG. 4 shows the apparatus of FIG. 1 in the assembled condition. After applying the metal indium film to the module cap top surface 38, the module 10 is inserted into the heat sink base recess 28. Thereafter, a vacuum pump 50 (shown schematically) applies a vacuum through tube 34 to the heat sink-module interface within the heat sink recess 28. A vacuum curing adhesive 52 is then applied continuously along the junction of the module cap 44 and the heat sink wall surface 30. The vacuum extracts entrapped air between the metal layer of indium and the heat sink assembly to create an intimate thermal interface that is devoid of air that would compromise the thermal transmission capability of the indium interface layer. Finally, the vacuum tube 34 is crimped and sealed at 54 (as show in the fragmentary view of FIG. 5) and the tube is terminated beyond the crimped location 54.

When rework or maintenance is required, the adhesive 52 is heated and the heat sink 20 is removed by attaching a threaded tool that engages the slotted threads at the heat sink opening 26 to separate the heat sink 20 from the multi chip module 10.

The foregoing description of embodiments of the invention has been presented for purposes of illustration and description. It is not intended to be exhaustive or limit the invention to the precise form disclosed. Many modifications and variations, both as suggested and others, are possible in light of the above teaching. It is intended that the scope of the invention not be limited by the description and illustrations, but rather by the claims appended hereto.

What is claimed is:

1. An apparatus including a metallic thermal interface comprising:
   a heat sink including a base portion and an extended surface portion;
   a module, having a metal cap including top and side portions, to be attached to said heat sink;
   a layer of metallic thermal interface material selected from the group consisting of indium and a malleable indium alloy;
   a depression in said heat sink base with wall surface portions capable of closely receiving said module metal cap portions;
   said module being positioned with said metal cap disposed in said heat sink depression with said layer of metallic thermal interface material positioned between said metal cap and the surface portions of said heat sink depression;
   sealing means extending continuously along the marginal periphery of said heat sink depression where it adjoins said module metal cap for sealing said module to said heat sink; and
   means for evacuating the interface between said module and the surface portions of said heat sink depression, whereby air is excluded from the thermal interface region between said module and said surface portions of said heat sink depression.

2. The apparatus of claim 1 wherein said layer metallic thermal interface material is formed of a malleable indium alloy wherein the alloying metal is selected from the group consisting of aluminum, copper and both aluminum and copper.

3. The apparatus including a metallic thermal interface of claim 1 wherein said module is a multi chip module.

4. The apparatus including a metallic thermal interface of claim 3 wherein said sealing means comprises a vacuum curing adhesive.

5. The apparatus including a metallic thermal interface of claim 4 wherein said evacuating means comprises a passageway, from a vacuum source to a central portion of the heat sink depression surface confronting said multi chip module metal cap, through which air is evacuated from the module interface with the heat sink depression with the passageway thereafter blocked and terminated at the side of said blockage remote from said module/heat sink interface to exclude air from said module/heat sink interface.

6. The apparatus including a metallic thermal interface of claim 5 where said layer of metallic thermal interface material is secured to the top portion of said multi chip module metal cap prior to positioning said multi chip module metal cap in said heat sink depression.

7. The apparatus including a metallic thermal interface of claim 6 wherein said heat sink extended surface portion comprises a series of parallel fins extending from and integral with said base portion.

8. The apparatus including a metallic thermal interface of claim 7 wherein said heat sink further comprises a threaded recess opening away from said base portion which is engageable by a threaded tool, whereby said heat sink can be disassembled from said module by heating said sealing means and using said threaded tool to engage said threaded recess and pull said heat sink away from said module.

9. The method for effecting a metallic thermal interface between a multi chip module and a heat sink including a base portion, wherein said module includes a metal cap portion that encloses the top and sides of the module and said heat sink includes a surface defining a depression in the heat sink base portion comprising:
   inserting said multi chip module cap portion into said heat sink depression with a layer of metallic thermal interface material between said module and said surface defining said heat sink depression;
   applying a sealing agent continuously along the edge of said heat sink depression to seal the interface between said module cap portion and the surface defining said heat sink base portion depression; and
   evacuating the sealed interface between said module cap portion and the surface defining said heat sink depression to establish intimate thermal attachment between module and heat sink and exclude oxygen from contact with said layer of metallic thermal interface material.

10. The method of claim 9 wherein the metallic thermal interface material utilized in the step of inserting said multi chip module cap portion into said heat sink depression is selected from the group consisting of indium and malleable indium alloys.

11. The method of claim 10 further including the step of attaching said layer of metallic thermal interface material to said multi chip module metal cap portion prior to inserting said module cap portion into said heat sink depression.

12. The method of claim 11 wherein said sealing agent comprises a vacuum cured adhesive.

13. The method of claim 12 wherein said step of evacuating the sealed interface comprises removing air through an air passage that communicates with a central portion of the surface of said depression which confronts the top of said module cap portion; blocking said air passage and terminating said air passage at the side of said blockage remote from said sealed interface.

\* \* \* \* \*